(12) United States Patent
Bowers

(10) Patent No.: US 8,816,431 B2
(45) Date of Patent: Aug. 26, 2014

(54) SHIELDED GATE MOSFET DEVICE WITH A FUNNEL-SHAPED TRENCH

(75) Inventor: Brian Bowers, Kaysville, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 26 days.

(21) Appl. No.: 13/416,416

(22) Filed: Mar. 9, 2012

(65) Prior Publication Data

US 2013/0234241 A1    Sep. 12, 2013

(51) Int. Cl.
*H01L 29/78* (2006.01)

(52) U.S. Cl.
USPC ........... 257/330; 257/335; 257/340; 257/341; 257/E29.262

(58) Field of Classification Search
CPC ............ H01L 29/7813; H01L 29/7831; H01L 29/66348; H01L 21/765; H01L 29/4232
USPC .................. 257/330, 335, 340–341, E29.262, 257/E21.41
See application file for complete search history.

(56) References Cited

U.S. PATENT DOCUMENTS

| | | |
|---|---|---|
| 4,145,703 A | 3/1979 | Blanchard |
| 4,295,924 A | 10/1981 | Garnache |
| 4,326,332 A | 4/1982 | Kenney |
| 4,682,405 A | 7/1987 | Blanchard et al. |
| 4,697,201 A | 9/1987 | Mihara |
| 4,754,310 A | 6/1988 | Coe |
| 4,941,026 A | 7/1990 | Temple |
| 4,969,028 A | 11/1990 | Baliga |
| 5,032,888 A | 7/1991 | Seki |
| 5,134,448 A | 7/1992 | Johnsen et al. |
| 5,298,781 A | 3/1994 | Cogan et al. |
| 5,429,977 A | 7/1995 | Lu et al. |
| 5,442,214 A | 8/1995 | Yang |
| 5,474,943 A | 12/1995 | Hshieh et al. |
| 5,541,430 A | 7/1996 | Terashima |
| 5,973,360 A | 10/1999 | Tihanyi |
| 5,981,344 A | 11/1999 | Hshieh et al. |
| 6,137,135 A | 10/2000 | Kubo |
| 6,165,870 A | 12/2000 | Shim et al. |
| 6,184,555 B1 | 2/2001 | Tihanyi et al. |
| 6,274,457 B1 | 8/2001 | Sakai et al. |

(Continued)

FOREIGN PATENT DOCUMENTS

| | | |
|---|---|---|
| EP | 0 053 854 A1 | 6/1982 |
| JP | 2000-012842 A | 1/2000 |
| WO | 97/29518 A1 | 8/1997 |

OTHER PUBLICATIONS

Barkhordarian, Vrej, "Power MOSFET Basics", International Rectifier, El Segundo, CA, Apr. 3, 2003, 12 pages.

*Primary Examiner* — Matthew W Such
*Assistant Examiner* — Ali Naraghi
(74) *Attorney, Agent, or Firm* — Brake Hughes Bellermann LLP

(57) ABSTRACT

A MOSFET device has a funnel-shaped trench etched in a semiconductor substrate. The funnel-shaped trench has flared rim extending from a wider cross section trench mouth at the surface of the semiconductor substrate to a narrower cross section trench body portion which terminates in an epilayer portion of the semiconductor substrate. A gate electrode is disposed in the trench on the flared rim. Source and gate regions of the device abut upper and lower portions of the flared rim, respectively. A drain region of the device, which abuts the narrower cross section trench body portion, is self-aligned with a lower edge of a gate electrode.

29 Claims, 11 Drawing Sheets

(56) References Cited

U.S. PATENT DOCUMENTS

| | | |
|---|---|---|
| 6,277,706 B1 | 8/2001 | Ishikawa |
| 6,359,308 B1 | 3/2002 | Hijzen et al. |
| 6,444,574 B1 | 9/2002 | Chu |
| 6,465,869 B2 | 10/2002 | Ahlers et al. |
| 6,486,039 B2 | 11/2002 | Yoo et al. |
| 7,064,385 B2 | 6/2006 | Dudek et al. |
| 7,282,765 B2 | 10/2007 | Xu |
| 7,598,144 B2 * | 10/2009 | Herrick et al. ............... 438/272 |
| 7,781,835 B2 | 8/2010 | Marchant |
| 2003/0178676 A1 * | 9/2003 | Henninger et al. ........... 257/340 |
| 2008/0150020 A1 | 6/2008 | Challa |
| 2009/0269896 A1 | 10/2009 | Chen et al. |

\* cited by examiner

400

410
Provide a semiconductor substrate

420
Form a trench in the semiconductor substrate with the trench having a flared rim extending down from a wider cross-section trench opening at about a top surface of the semiconductor substrate to a narrower cross-section trench body portion that terminates in the semiconductor substrate

430
Dispose a gate electrode in the trench on the flared rim

440
Form a drain region, a top of which is aligned with a lower edge of the gate electrode

450
Form a gate region abutting the flared rim above the drain region and form a source region above the gate region.

FIG. 4

SHIELDED GATE MOSFET DEVICE WITH A FUNNEL-SHAPED TRENCH

TECHNICAL FIELD

This description relates to semiconductor devices and fabrication technology. In particular, the description relates to metal-oxide-semiconductor field-effect transistor (MOSFET) devices.

BACKGROUND

MOSFET devices may be broadly categorized according to the relative altitudes of source, gate and drain terminal structures, or the orientations of the source-to-drain channels relative to the surfaces of the semiconductor substrates on which the devices are formed. In a lateral channel MOSFET, a source region and a drain region are arrayed in a lateral direction of a semiconductor substrate. The gate electrode is disposed atop the silicon substrate in between the source and drain regions. This lateral configuration of source, gate, and drain regions may be suitable for making smaller devices and for device integration. However, the lateral configuration may not be suitable for obtaining high power ratings for the devices because the voltage blocking capability of a device is proportional to the source-drain separation and because the drain-to-source current is inversely proportional to the length.

For power applications, vertical channel or trench gate MOSFETS may be preferred. In a vertical channel MOSFET, source, gate and drain regions are arrayed in a vertical direction of a semiconductor substrate. The source and drain terminals may be placed on opposite sides of a semiconductor substrate, and a gate electrode disposed in a groove or trench that is etched in the semiconductor substrate. This vertical configuration may be suitable for a power MOSFET device, as more surface space can be used as a source, and also the source and drain separation can be reduced. Reduction of the source and drain separation can increase the drain-to-source current rating and also can allow use of an epitaxial layer for the drain drift region to increase the device's voltage blocking capability.

Early known commercial trench gate MOSFET devices used V-shaped trenches. These V-shaped trenches can have drawbacks (e.g., high electric fields at the tip), which have been overcome in later developed devices using other shapes for the trenches (e.g., D-shaped (double-diffused) and U-shaped trenches). In known implementations, the gate electrode can be housed in the trenches. In a shielded gate power MOSFET (SGMOSFET), a deep trench houses an additional "shield" electrode disposed below the gate electrode. The shield gate electrode can be used to reduce the gate-drain capacitance (Cgd) (which is related to the gate-drain charge Qgd), and/or improve the breakdown voltage of the gate trench MOSFET device.

A measure of a MOSFET device's switching performance is given by the device's specific on-resistance (Rsp) or resistance per unit die area when the device is switched on. Lower Rsp values correspond to faster switching of the MOSFET device. Another measure of the switching performance of a MOSFET device is given by its characteristic gate-drain charge "Miller charge" (Qgd), which determines how much voltage or power is needed to drive or turn-on the device.

A figure of merit (FOM) of particular interest for discrete MOSFET devices combines both the Rsp and Cgd measures: FOM=Qgd*Rsp. MOSFETS with lower FOMs may be expected to have better performance than MOSFETS with higher FOMs.

Recent lateral double-diffused MOSFET (LDMOS) structures, which are a lateral channel version of D-MOSFETS, have achieved relatively low FOM values by aligning the drain region to the surface gate polysilicon electrode to minimize gate overlap of the drain region, and thereby achieve relatively low Qgd values.

Consideration is now being given to MOSFET device structures and fabrication processes. In particular, consideration is being given to MOSFET device structures or architectures with a view to lower FOM values. Additional consideration is being given to reduce cell pitch or device size for devices with relatively low FOM values.

SUMMARY

In one general aspect, a MOSFET device includes a funnel-shaped trench having a flared rim etched in a semiconductor substrate. The flared rim has an upper edge at a wider cross section trench opening at about a top surface of the semiconductor substrate and a lower edge at a top opening of a narrower cross section trench body portion that terminates in the semiconductor substrate. A gate electrode is disposed in the funnel-shaped trench on a gate oxide layer formed on the flared rim. Source, gate and drain regions are formed in the semiconductor substrate. The gate region abuts the flared rim. The drain region abuts sidewalls of the narrower cross section trench body portion. A top of the drain region is aligned with a lower edge of the gate electrode.

In one general aspect, a method for fabricating a MOSFET device includes forming a trench in the semiconductor substrate. Forming a trench in the semiconductor substrate includes forming a trench with a flared rim extending down from a wider cross section trench opening at about a top surface of the semiconductor substrate surface to a narrower cross section trench body portion that terminates in the silicon substrate. The method includes disposing a gate electrode in the trench on the flared rim. The method further includes forming a drain region in the semiconductor substrate with a top of the drain region aligned with about a lower edge of the gate electrode.

In another general aspect, a MOSFET device includes a funnel-shaped trench having a flared rim etched in a semiconductor substrate. The funnel-shaped trench has a trench body disposed below the flared rim. The flared rim has a sidewall with a first slope and the trench body has a sidewall with a second slope different from the first slope. A gate electrode is disposed in the trench on a gate oxide layer formed on the flared rim. The device's source, gate and drain regions abut an upper portion of the flared rim, a lower portion of the flared rim; and sidewalls of the trench body, respectively. Further, the drain region has a top aligned with a lower edge of the gate electrode.

The details of one or more implementations are set forth in the accompanying drawings and the description below. Other features will be apparent from the description and drawings, and from the claims.

BRIEF DESCRIPTION OF THE DRAWINGS

FIG. 4 is a flowchart that illustrates an example method of fabricating a trench gate or shielded gate trench MOSFET device in which device drain, source and gate regions are arranged vertically in a semiconductor substrate, and in which the drain region is self-aligned with a gate electrode of the device, in accordance with the principles of the disclosure herein.

Like reference symbols in the various drawings indicate like elements.

DETAILED DESCRIPTION

A shielded gate trench MOSFET (SMOSFET) device includes a trench having a flared or beveled rim, in accordance with the principles of the disclosure herein. A gate electrode is disposed in the trench on the flared or beveled rim. A shield electrode may also be disposed in the trench below the rim, deeper in the trench body toward the trench bottom. In the device, a drain region is aligned with the gate electrode to reduce gate overlap of the drain region, in accordance with the principles of the disclosure herein. In some embodiments, only features on one side of the SMOSFET device are labeled because many of the features are mirrored. The cross-sectional diagrams illustrated below are representative drawings. Processing variations, variations in aspect ratios, differences in design dimensions, and/or so forth can result in different shapes and/or non-idealities.

Figure 1:
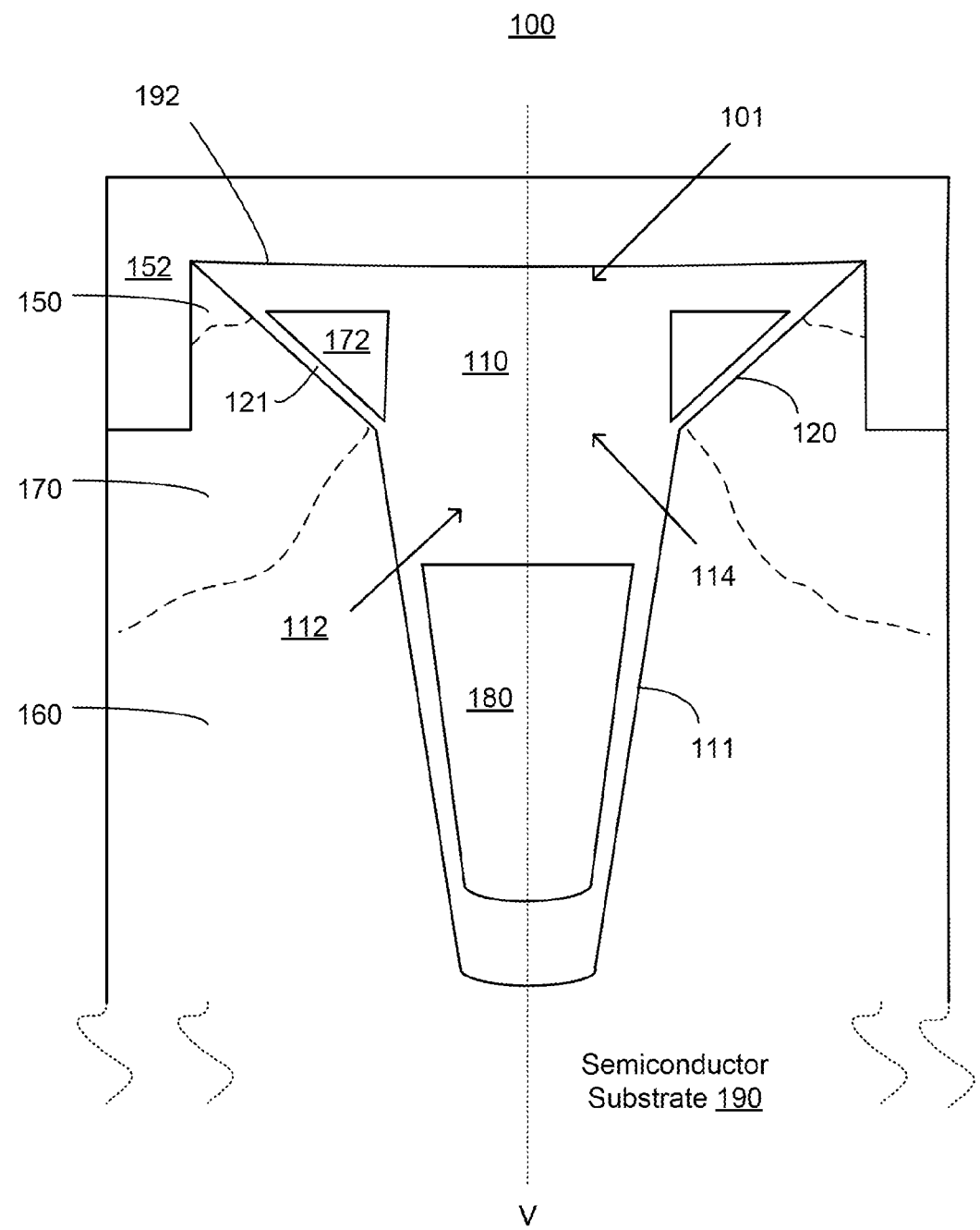
FIG. 1 is a drawing that illustrates a cross-sectional view of a shielded gate trench metal-oxide-semiconductor field-effect transistor (SMOSFET) device, in accordance with the principles of the disclosure herein.

FIG. 1 is a schematic cross-sectional view of an example shielded gate trench metal-oxide-semiconductor field-effect transistor (SMOSFET) device 100. SMOSFET device 100 may include a vertical funnel-shaped trench 110 (which can be referred to as a trench) etched in a semiconductor substrate 190 (e.g., a silicon substrate). Funnel-shaped trench 110 may have a flared or beveled rim 120. Rim 120 may extend down from a wider trench opening 101 at the surface 192 of semiconductor substrate 190 to meet or transition into sidewalls 111 of a narrower trench body 112 within the semiconductor substrate 190. In FIG. 1 and other figures herein, SMOSFET device features at a greater (or deeper) depth in the silicon substrate are shown toward the bottoms of the figures and features at a lesser (or shallower) depth are shown toward the tops of the figures.

The trench opening 101 at surface 192 of the semiconductor substrate 190 is wider than a medial opening 114 of trench body 112. Accordingly, the beveled rim 120 extends between the trench opening 101 of the funnel-shaped trench 110 and the medial opening 114 at the top portion of the trench body 112. As shown in FIG. 1, the funnel-shaped trench 110 and the trench body 112 are both aligned along (or oriented along) the vertical axis V).

The transition from rim 120 to sidewalls 111 of the trench body 112 (at approximately medial opening 114) may be sharp as shown in FIG. 1 (i.e. with an abrupt change of linear slopes) or may be more rounded than shown. In either case, for convenience in description herein, the point or region over which rim 120 meets or transitions into sidewalls 111 may be referred to herein as the lower edge of rim 120. Similarly, the point or region over which rim 120 meets or transitions into the surface 192 of semiconductor substrate 190 may be referred to herein as the upper edge of rim 120.

Rim 120 may be flared at any angle, for example, between 20 degrees and 80 degrees to the trench normal (i.e., along vertical axis V of the trenches 110). FIG. 1 shows, for example, that rim 120 is flared at an angle of about 45 degrees to the trench normal.

SMOSFET device 100 may include a source region 150, a gate region 170 and a drain region 160 that are arrayed in a vertical direction of (or vertically stacked within) semiconductor substrate 190. Gate region 170 abuts rim 120. SMOSFET device 100 further includes a gate electrode 172 disposed over rim 120 separated by a gate dielectric layer 121. Gate electrode 172 may, for example, be made of doped polysilicon, metal, silicide, cobalt silicide, titanium silicide, or any combination thereof. Gate dielectric layer 121 may, for example, be made of oxide, nitride, oxy-nitride, high k dielectric materials and/or any combination thereof.

SMOSFET device 100 may also include a shield electrode 180 (e.g., a shield electrode made of polysilicon material) disposed in the trench body 112 inside the funnel-shaped trench 110 and at a depth that is below a depth of the gate electrode 172. The remainder of the trench body 112 volume is filled, for example, with dielectrics, insulating and resistive materials (e.g., gate dielectric or oxide, deposited oxides, inter-gate polysilicon, etc.). FIG. 1 also shows a source-substrate metal clamp or contact 152 disposed on a top portion (e.g., on at least a portion of the surface 192 of the semiconductor substrate 190) of the SMOSFET device 100. For visual clarity, gate and drain metallization or other contacts are not shown in FIG. 1

The architecture of SMOSFET device 100 with rim 120, shown in FIG. 1, may be configured to allow drain region 160 to be aligned with gate electrode 172. Such alignment may be achieved using, for example, the gate electrode itself as an aligning mask for controlling doping of the gate-drain interface regions, as is described below with reference to FIGS. 2A-2E. Alignment of drain region 160 with gate electrode 172 (by masking or blocking introduction of drain region dopants under the gate electrode) may be expected to reduce (or minimize) gate electrode 172 overlap with the drain region 160. This minimization of overlap may reduce the gate-drain capacitance (Cgd) and related gate-drain charge Qgd compared, for example, to a conventional V-trench gate MOSFET. Further, the vertical configuration (or vertical stacking) of source region 150, gate region 170, and drain region 160 may be expected to provide relatively low on-resistance (Rsp) values similar or comparable to the Rsp values of conventional trench MOSFETS that have a relatively small cell pitch (e.g., 0.8 μm).

An SMOSFET device having a drain region aligned with a gate electrode disposed on a flared surface of the trench rim (as shown in FIG. 1), may have a desirable figure of merit (FOM) value compared to other MOSFET types.

TABLE 1 shows comparative simulated performance parameters for three different types of MOSFETS, all which are rated at 25V, including (1) a commercially-available shielded gate trench MOSFET (PT8 25V SyncFET), (2) a lateral double-diffused MOSFET (LDMOSFET), and (3) a SMOSFET device of the type shown in FIG. 1. The performance parameters shown in TABLE 1, for example, include cell pitch, breakdown voltage (BV), threshold voltage (Vth), specific on-resistance (Rsp) at 4.5V, gate-drain charge (Qgd), and figure of merit (FOM).

TABLE 1

| Units | Cell Pitch μm | BV V | Vth V | Rsp (at 4.5 V) mΩ*cm² | Qgd nC/cm² | FOM (Rsp*Qgd) |
|---|---|---|---|---|---|---|
| PT8 25V SyncFET | 0.8 | 31.5 | 1.4 | 0.0439 | 162 | 7.1 |
| LDMOSFET | 5.0 | 30 | 1.09 | 0.119 | 37 | 4.4 |
| SMOSFET | 1.2 | 30.8 | 1.2 | 0.059 | 60 | 3.5 |

As shown in TABLE 1, PT8 25V SyncFET, which is a shielded gate V-trench MOSFET having a cell pitch of about 0.8 μm, has a lower Rsp value (0.0439 mΩ*cm²) than the Rsp value (0.119 mΩ*cm²) of the LDMOSFET having a cell pitch of about 5.0 μm. The SMOSFET device, which has a cell pitch of about 1.2 μm, has an Rsp value (0.059 mΩ*cm²) that is slightly higher than that of the PT8 25V SyncFET, but is substantially lower than the Rsp value (0.119 mΩ*cm²) of the LDMOSFET.

Conversely, the larger pitch LDMOSFET has a low Qgd value (37 nC/cm²) versus the Qgd value (162 nC/cm²) for the smaller cell pitch V-trench MOSFET PT8 25V SyncFET. The beveled-rim trench SMOSFET device having a cell pitch of about 1.2 μm, has a Qgd value (60 nC/cm²) which is substantially lower than the Qgd value (162 nC/cm²) of the PT8 25V SyncFET, but is only slightly higher than the Qgd value (37 nC/cm²) of the LDMOSFET.

The FOM values for the small pitch PT8 25V SyncFET and the large pitch LDMOSFET are 7.1 and 4.4, respectively. TABLE 1 also demonstrates that the SMOSFET device has intermediate values of Rsp and Cgd (0.059 mΩ*cm² and 60 nC/cm², respectively), but has an FOM value 3.5 that is better than the FOM values of both the PT8 25V SyncFET (FOM=7.1) and the LDMOSFET (FOM=4.4).

FIGS. 2A-2H are schematic cross-sectional views of a SMOSFET device 200 having a flared or beveled rim at various processing stages in its fabrication, in accordance with the principles of the disclosure herein. SMOSFET device 200, like SMOSFET device 100 shown in FIG. 1, may have biaxial symmetry at least in the plane of the cross sectional views shown (as shown for SMOSFET device 100 in FIG. 1). Accordingly, for convenience in description herein reference may be made only to one of the two symmetric halves of SMOSFET device 200. Further, various stages in the fabrication of SMOSFET device 200 may involve processes or techniques that are the same or similar to processes or techniques (e.g., patterning, masking, lithography, oxide growth or deposition, dielectric deposition, epitaxial layer growth, chemical mechanical polishing or planarization, ion implantation and drive, etc.) that can be used in the microelectronics industry for semiconductor device fabrication, and more particularly for fabrication of trench gate MOSFETS or shield gate MOSFETS. For brevity, such semiconductor device fabrication processes and techniques may be mentioned, but may not be described in detail herein. Further, it will also be understood that the various processing stages described or mentioned herein are merely illustrative. Accordingly, various processing stages may be simplified and/or intermediate processing stages may not be described or shown in detail.

Figure 2A:
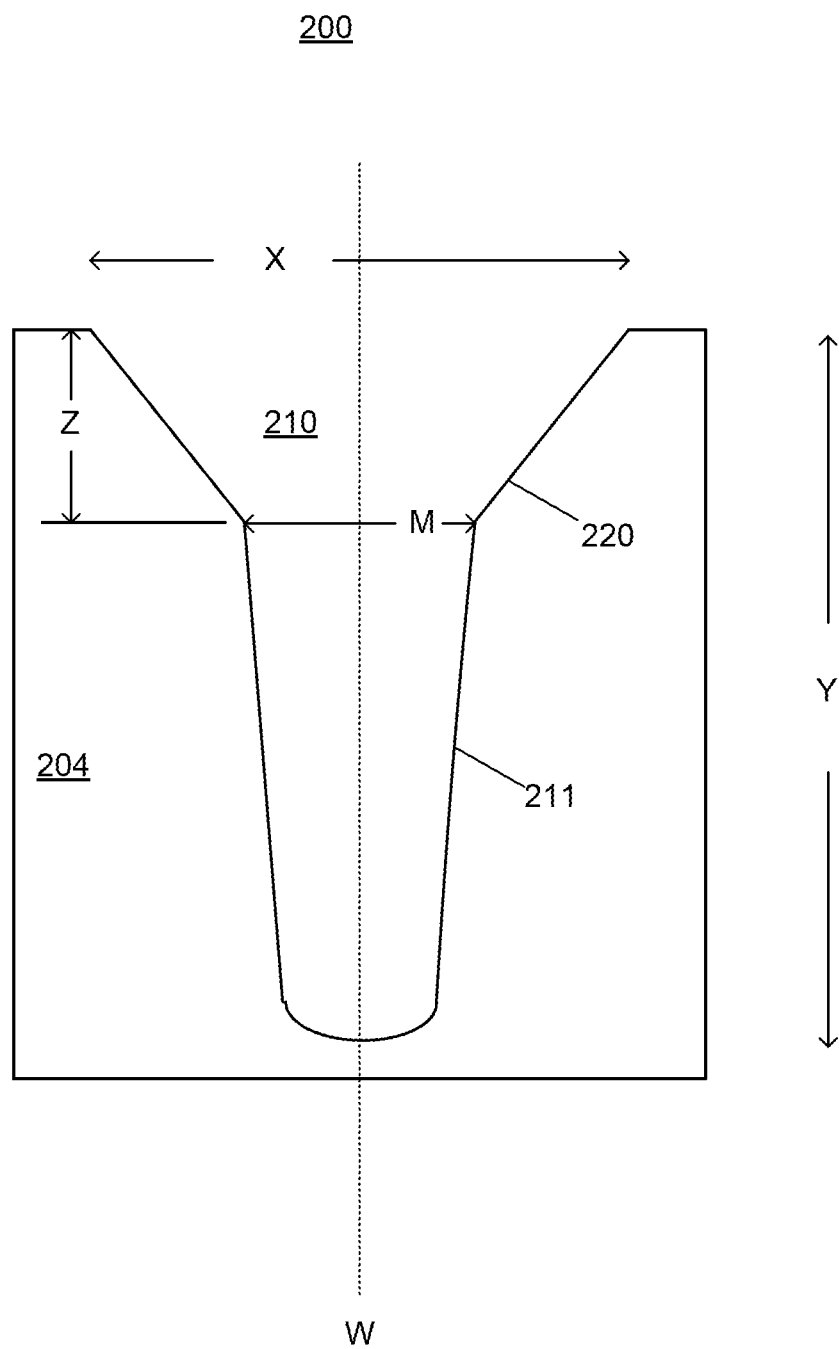
FIGS. 2A through 2H are schematic cross-sectional views at various stages of formation of a shielded gate trench MOSFET device, in accordance with the principles of the disclosure herein.

FIG. 2A shows a funnel-shaped vertical trench 210 (aligned along vertical axis W and which can be referred to as a trench) having a flared or beveled rim 220. Trench 210 may be etched, for example, in an epitaxial layer 204 grown on a semiconductor substrate (not shown). The semiconductor substrate may, for example, be conductive (e.g., a heavily doped) n-type silicon substrate. Epitaxial layer 204 may, for example, be a lightly doped (e.g., a lightly arsenic doped) n-type epitaxial layer grown over the silicon substrate. Funnel-shaped vertical trench 210 may have vertical (aligned along vertical axis W) or near vertical side walls 211 descending from rim 220, and may terminate within epitaxial layer 204 (as shown) or may extend deeper into the silicon substrate (not shown).

As shown in FIG. 2A, trench 210 can have a depth Y in the semiconductor substrate and an opening width X at the surface of the semiconductor substrate In some embodiments, trench depth Y may, for example, be in the range of about 0.8-10.0 μm, and opening width X may, for example, be in the range of about 0.5 to 4.0 μm. In other embodiments trench depth Y and opening width X can be larger or smaller than these example ranges. Further, as shown in FIG. 2A, rim 220 of trench 210 can narrow or taper down from the opening width X at the surface of the semiconductor substrate to a medial trench width Z over a depth M in the silicon substrate. Depth M and width Z can be appropriately selected in consideration of design dimensions of SMOSFET device 200. In some embodiments, depth M and width Z may, for example, each be in the range of about 0.2 to 0.5 μm. In other embodiments, depth M and width Z may be larger or smaller than the example range.

Vertical trench 210 may be formed by etching the silicon substrate through an opening in a lithographically patterned masking layer made of suitable etch-resistant materials (e.g., photoresists, silicon oxide, or silicon nitride, etc.) disposed on the silicon substrate surface. Suitable etchants for etching vertical trench 210 may include wet etchants (e.g., KOH, $HNO_3$ and HF, etc.) and/or dry etchants (e.g., halogen-based reactive ions or plasmas, etc.). The etchants used may have varying bias, selectivity, isotropic etching and anisotropic etching properties. The flared or beveled rim shape may, for example, be formed by an etchant's isotropic undercut of the masking layer opening. Alternatively or additionally, the flared or beveled rim shape of the rim 220 may be formed by sequential etching of vertical trench 210 under more anisotropic etching conditions followed by (or preceded by) less anisotropic etching conditions. Variable etching conditions during etching of trench 210 may be obtained, for example, by varying etch chemistries (e.g., by changing reactive ion etching process parameters) during the etching. As an example, reactive ion etching processes deployed for etching trench 210 may be based on $SF_6+O_2$ dry etch chemistries that are commonly deployed in silicon device manufacturing.

Adjusting etch chemistries and/or etching conditions may allow control of the length and shape of flared or beveled rim 220. FIG. 1 and FIGS. 2A-2H that are presented herein show rim 220 in cross section as having a linear profile from its upper edge to its lower edge. However, it will be understood that the figures are presented herein only for purposes of illustration, and that flared or beveled rim 220 may have other shapes (e.g., a curved profile in the cross section shown in FIG. 3). Further, the figures show flared or beveled rim 220 as having an inclination of about 45 degrees relative to near vertical sidewalls 211 of trench 210 only for purposes of illustration. Flared or beveled rim 220 may have other inclinations or slopes (e.g., 20 degrees to 80 degrees) relative to sidewalls 211 in other implementations of SMOSFET device 200. In some embodiments, the angle of the sidewalls 211 of funnel-shaped vertical trench 210 relative to vertical axis W can be different than the angle of rim 220 of funnel-shaped vertical trench 210 relative to vertical axis W. The various shapes and inclinations of flared or beveled rim 220 of the trench 210 may be formed by using appropriate etchants and/or etching conditions for etching of trench 210.

Figure 2B:
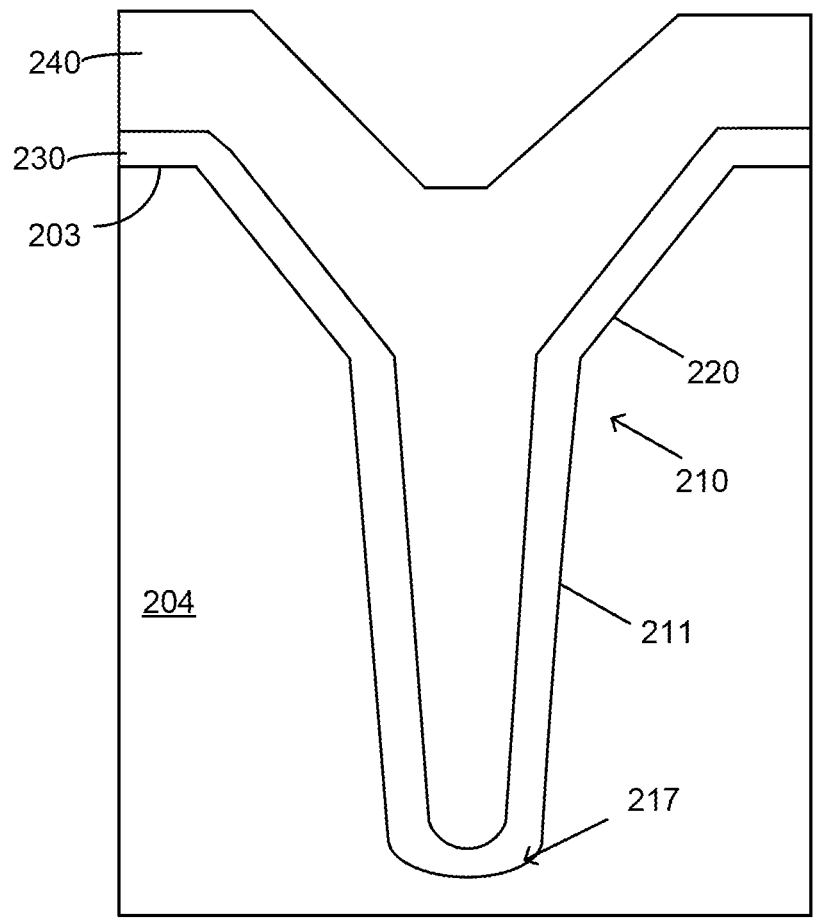

After trench 210 having a flared or beveled rim 220 is etched, at subsequent processing stages in the fabrication of SMOSFET device 200, a shield oxide layer 230 and a shield polysilicon layer 240 may be formed (FIG. 2B). Shield oxide layer 230 may be thermally grown at about 800° C. to 1200° C. (e.g., 1150° C.) using relatively high temperature oxidation processes. Alternatively, shield oxide 230 layer may be formed using a combination of thermally grown oxide and/or deposited oxide. Shield polysilicon layer 240 may be deposited using a polysilicon deposition technique (e.g., silane decomposition).

Shield oxide layer 230 may line exposed silicon surfaces along the sidewalls 211, bottom 217, and the rim 220 of trench 210 and extend over silicon substrate top surface 203 next to trench 210. Shield oxide layer 230 may, for example, have a thickness of about 0.1 μm. In other embodiments, the thickness of the shield oxide layer 230 can be greater than 0.1 μm or less than 0.1 μm. Portions of shield oxide layer 230 may later serve as a shield gate oxide in SMOSFET device 200. Shield polysilicon layer 240, which is deposited over shield oxide layer 230, may, for example, have a thickness of about 0.5 μm and can completely fill the deep portions of trench 210 (towards the bottom 217. In other embodiments, the thickness of the shield oxide layer 230 can be greater than 0.5 μm or less than 0.5 μm. Portions of shield polysilicon layer 240 may later function as shield gate electrode 242 (FIG. 2C) in SMOSFET device 200.

The next processing stages in the fabrication of SMOSFET device 200 can be similar to processing stages in the fabrication of a shielded gate MOSFET device. These next processing stages may include etch back of shield oxide layer 230 and shield polysilicon layer 240 toward geometrically defining features shown in FIG. 2C such as shield gate electrode 242, deposition of an inter-gate polysilicon or dielectric layer 244, growth of a gate oxide 221, and deposition of a gate polysilicon layer 246.

Figure 2C:
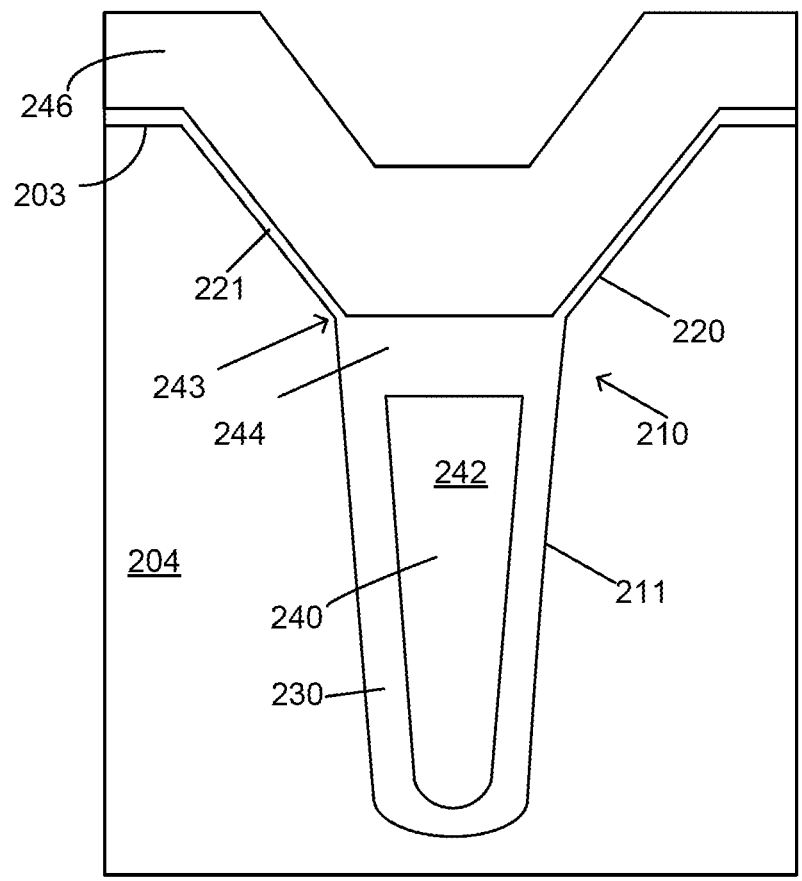

FIG. 2C shows SMOSFET device 200 after shield polysilicon layer 240 (shown in FIG. 2B) has been etched back to form shield gate electrode 242 and topped with the inter-gate polysilicon (e.g., undoped polysilicon) or dielectric layer 244. FIG. 2C also shows SMOSFET device 200 with gate oxide 221 formed on the beveled rim 220 of trench 210, and a gate polysilicon layer 246 extending over gate oxide 221 and silicon substrate top surface 203 next to trench 210. A portion of gate poly silicon layer 246 may later be used to form gate electrode 272 for SMOSFET device 200 (FIG. 2F).

Gate oxide 221 may be a thermally grown oxide, a deposited dielectric, or a combination of the two. For example, gate oxide 221 may be formed thermally by a low temperature, wet oxidation process followed by a high temperature, dry oxidation process. Such thermal oxidation can yield a thermal gate oxide 221 with a thickness in the range of approximately 200 to 1500 Å. In an example device, gate oxide 221 may be about 300 angstroms thick. In some embodiments, gate oxide 221 can have a thickness less than 200 Å or a thickness greater than 1500 Å. Inter-gate polysilicon or dielectric layer 244 and gate polysilicon layer 246 may be deposited using one or more processes for the purpose (e.g., using undoped and doped silane decomposition processes).

Gate polysilicon layer 246 may, for example, be about 0.3 μm to 0.5 μm thick. In some embodiments, the gate poly silicon layer 246 can have a thickness less than 0.3 μm or a thickness greater than 0.5 μm. The thickness of inter-gate polysilicon or dielectric layer 244 may be selected to fill deep portions of trench 210 up to about the same height as the lower edge 243 of rim 220. From another perspective, the thicknesses of the various layers may be selected so that an interface of inter-gate polysilicon or dielectric layer 244 and the gate polysilicon layer 246 is at about the same height as the lower edge 243 of rim 220 as shown in FIG. 2C.

Next in the fabrication of SMOSFET device 200, a self-aligned drain implant (not shown in FIG. 2C) process may be performed (e.g., carried out). In preparation for this self-aligned drain implant process, gate polysilicon layer 246 in trench 210 may be etched or recessed back to inter-gate polysilicon or dielectric layer 244 to create a recess 247 in the gate polysilicon layer 246. This etching or recessing may define a residual portion 248 of gate polysilicon layer 246, which may serve as a mask for the self-aligned drain implant. Portions of residual portion 248 of gate polysilicon layer 246 may also later serve to form a gate electrode precursor 274 for SMOSFET device 200.

Figure 2D:
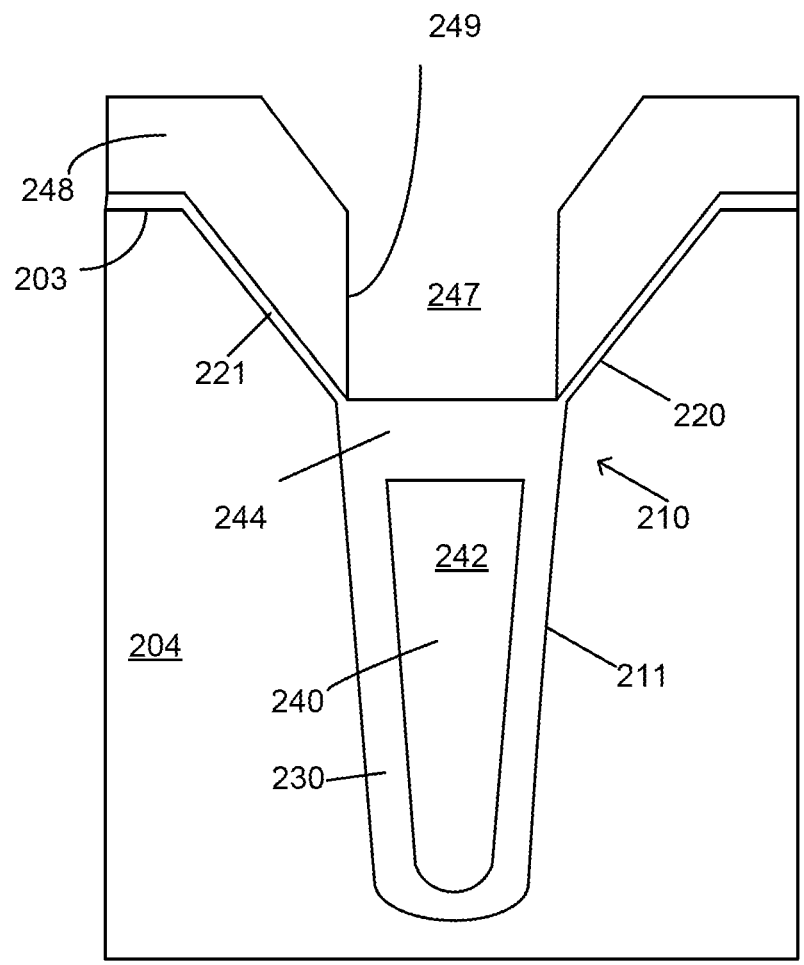

FIG. 2D shows SMOSFET device 200 after etching or recessing of gate polysilicon layer 246 to inter-gate polysilicon or dielectric layer 244 in trench 210. Residual portion 248 of gate polysilicon layer 246 may be disposed on (e.g., cover) gate oxide 221 on rim 220, and extend over silicon substrate top surface 203 next to trench 210. Residual portion 248 of gate polysilicon layer 246 and inter-gate polysilicon or dielectric layer 244 may form (e.g., define the boundaries of) a recess 247. An etched surface 249 of residual portion 248 in recess 247 may, for example, form a near vertical extension of vertical or near vertical sidewalls 211 of trench 210. The vertical extension may extend upward from about a corner of rim 220 and a top surface of inter-gate polysilicon or dielectric layer 244. Residual portion 248 of gate polysilicon layer 246 above rim 220 may provide a self-aligning (gate) mask for a drain implant. An example self-aligned (i.e. aligned with the gate/rim edge) drain implant may include implanting n-type ions in the top of drain region 160 shown in FIG. 2E. The location of the drain implant may be controlled by directing ion beams angled toward the corner defined by etched surface 249 of residual gate polysilicon portion 248, the lower edge 243 of rim 220, and a top surface of inter-gate polysilicon or dielectric layer 244. Ion implant doses, energies, and thermal drive budgets for the drain implant in the drain region 160 may be selected to form designed gate-aligned drain doping profiles for SMOSFET device 200. An example drain implant may be an arsenic implant with a dose in the range of about 8E13-2E14 at an energy in the range of about 110-130 keV.

As an alternate or in addition to using drain implant processes, self-aligned (i.e. aligned with the gate/rim edge) drain region 170 may be formed by dopant diffusion from solid sources. For example, a phosphorus doped glass may be deposited or placed in recess 247 to auto dope the drain region during post thermal processing. Residual portion 248 of gate polysilicon layer 246 above rim 220 may provide a self-aligning (gate) mask for the drain diffusion.

Figure 2E:
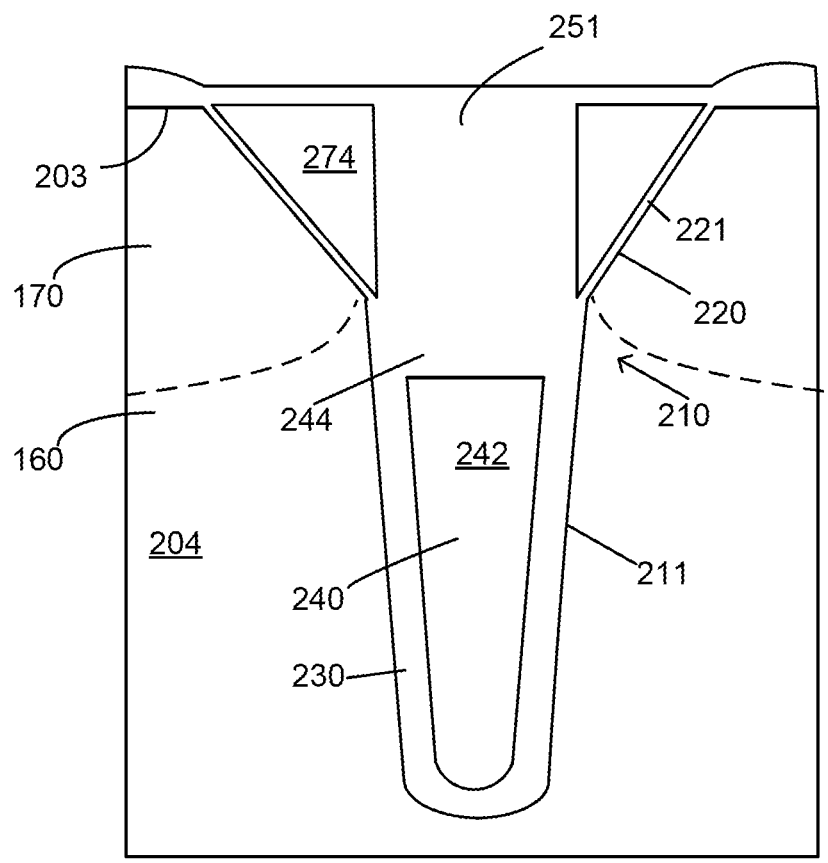
Figure 2F:
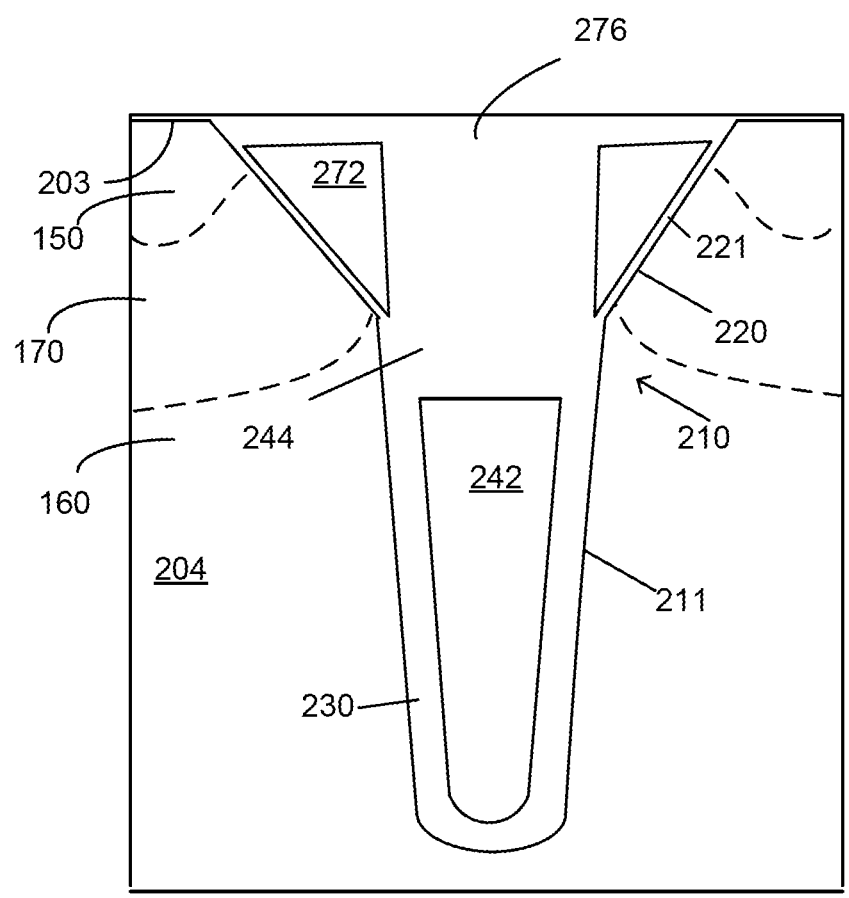

The next processing stages in the fabrication of SMOSFET device 200 may again be the same or similar to parallel processing stages in the fabrication of a trench gate MOSFET devices. These next processing stages may include deposition of a conformal oxide layer (or polysilicon for higher gate resistance (Rg) devices) to fill recess 247, planarization of the deposited conformal oxide layer and residual portion 248 of gate polysilicon layer 246 toward defining a gate electrode precursor 274 (FIG. 2E), and a p-well implant (e.g., boron or $BF_2$) and drive. FIG. 2E shows SMOSFET device 200 after planarization (e.g., using chemical mechanical polishing (CMP)) with deposited conformal oxide layer 251 filling recess 247 (shown in FIG. 2D). The planarization removes residual portion 248 of gate polysilicon layer 244 lying over silicon substrate top surface 203 next to trench 210, and defines gate electrode precursor 274. The p-well implant (e.g., boron or $BF_2$) and drive forms a p-well abutting gate oxide 221/gate electrode precursor 274 in gate region 170.

Further processing stages in the fabrication of SMOSFET device 200 may involve planarization and recessing of a gate electrode precursor 274 toward defining a gate electrode 272, deposition of a conformal dielectric layer (e.g., a boron phosphorus silicon glass (BPSG) layer) and planarization, and a source implant process. FIG. 2F shows SMOSFET device 200 with a gate electrode 272, which is geometrically defined by the recessing of gate electrode precursor 274, disposed over rim 220. As shown in the figure, gate electrode 272 and trench 210 are covered with a planarizing BPSG dielectric layer 276. FIG. 2F also shows SMOSFET device 200 with n-doped source region 150 resulting from a source implant (e.g., a phosphorus implant) and drive.

Next processing stages in the fabrication of SMOSFET device 200 may involve planarization of SMOSFET device 200 to expose silicon substrate top surface 203 next to trench 210 for a self-aligned (source) contact etch, a heavy body (HB) implant, and further device metallization processes.

The HB implant may be designed to obtain p+ doped body regions (not shown) in SMOSFET device 200. An example HB implant may be a $BF_2$ implant.

Figure 2G:
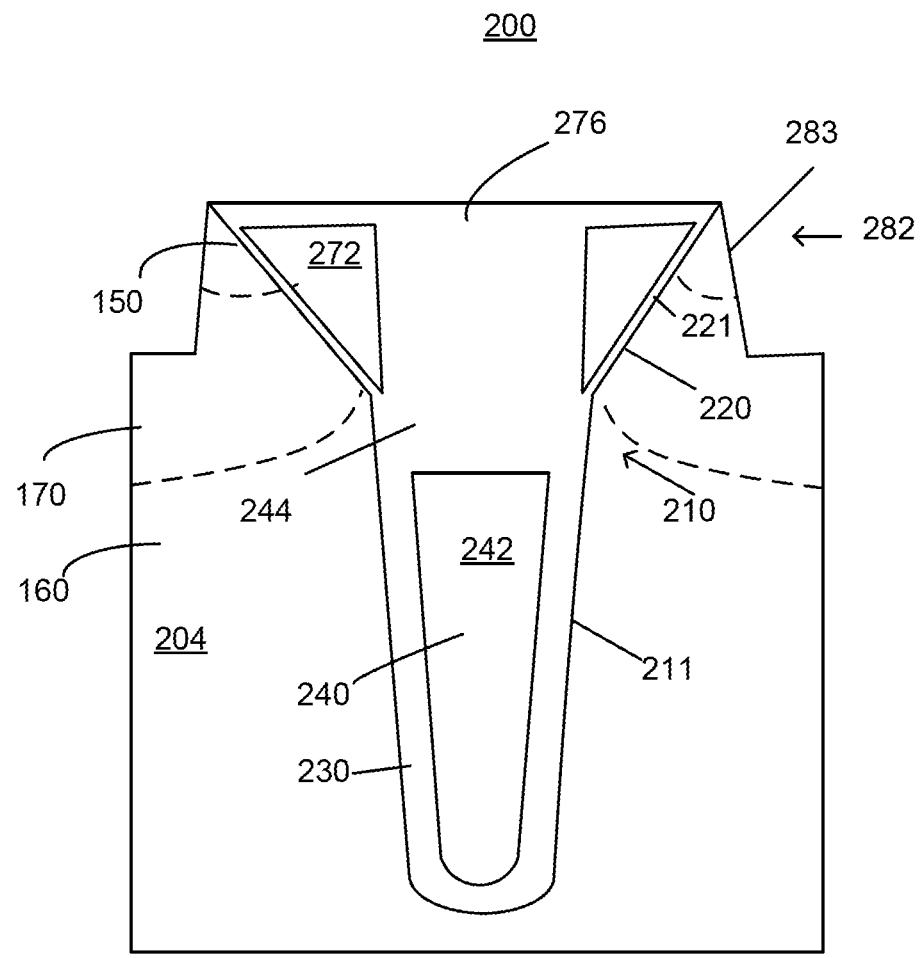

The self-aligned contact etch may be designed to expose more silicon surface area for making a metal contact to source region 150 of SMOSFET device 200. The self-aligned contact etch may, for example, be a dry etch based on $SF_6+O_2$ plasma chemistries. FIG. 2G shows a planarized SMOSFET device 200, with a volume 282 of silicon that was previously beneath exposed silicon substrate top surface 203 next to trench 210 (FIG. 2F) etched away to expose contact surfaces 283. This self-aligned contact etch may, for example, have removed silicon to a depth of about 0.3 µm to expose contact surfaces 283.

Figure 2H:
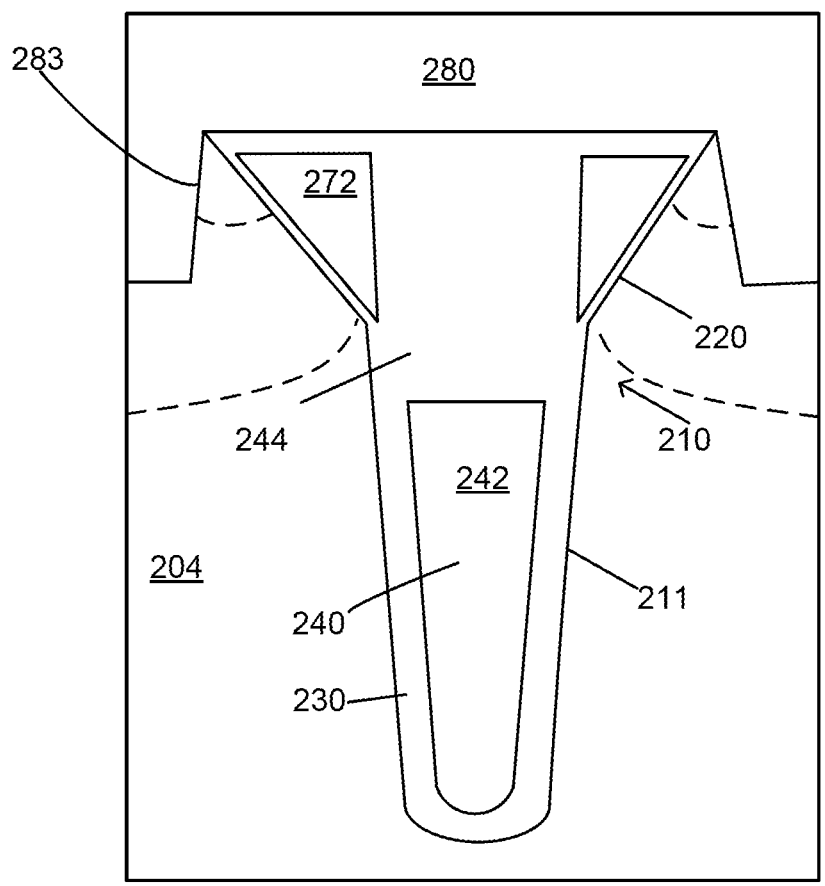

FIG. 2H shows SMOSFET device 200 with a top metal layer 280 deposited in volume 282 in contact with surfaces 283 and lying over the top of trench 210 to form a self-aligned source contact. Metal layer 280 may, for example, be an aluminum layer, which is separated from silicon surfaces 283 by a suitable barrier metal layer (not shown). The aluminum layer may, for example, be 3 to 7 µm thick, and the barrier metal layer, may, for example, be a 200-800 Angstroms thick titanium and/or tungsten layer.

Figure 3:
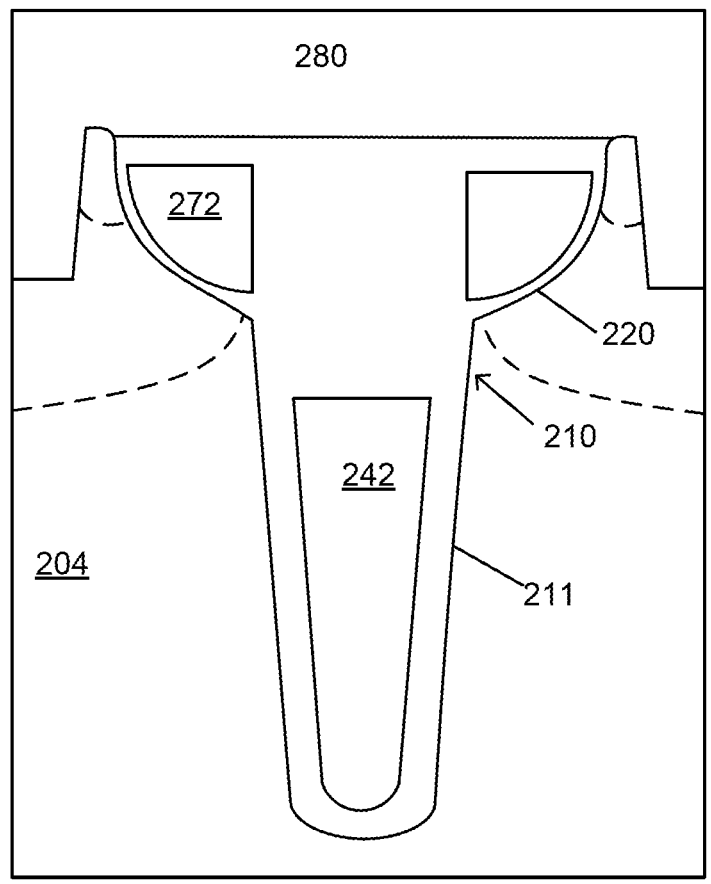
FIG. 3 is a drawing that illustrates a cross-sectional view of a shielded gate trench metal-oxide-semiconductor field-effect transistor (SMOSFET) device in which a flared or beveled trench rim has a curved shape, in accordance with the principles of the disclosure herein.

As noted previously, the rim 220 of the trench 210 in SMOSFET device 200 on which gate electrode 272 is disposed may have a non-linear slope or profile between the upper and lower edges of the rim 220. FIG. 3 shows an instance of SMOSFET device 200 in which rim 220 of the trench 210 has a curved profile between the upper and lower edges of the rim 220. The curved profile can be formed, for example, by varying etch chemistries (e.g., by changing reactive ion etching process parameters) during the etching, as described above with reference to FIG. 2A FIG. 4 shows a flowchart of an example method 400 of fabricating a trench gate or shielded gate MOSFET device in which device drain, source and gate regions are arranged vertically in a semiconductor substrate, and in which the drain region is self-aligned with a gate electrode of the device.

Method 400 includes providing a semiconductor substrate (410), forming a trench in the semiconductor substrate with the trench having a flared rim extending down from a wider cross-section trench opening at about a top surface of the semiconductor substrate to a narrower cross-section trench body portion that terminates in the semiconductor substrate (420). Method 400 further includes disposing a gate electrode in the trench on the flared rim (430), and forming a drain region in the semiconductor substrate with a top of the drain region aligned with about a lower edge of the gate electrode disposed on the flared rim (440). Method 400 also includes forming a gate region abutting the flared rim above the drain region and forming a source region above the gate region (450).

Method 400 may be incorporated into, merged with, or may extend methods for fabricating conventional trench gate MOSFETS (VMOSFETS) and/or shielded gate trench MOSFETS (SMOSFETS). Accordingly, method 400 may be described herein with reference to and in the context of fabrication processes conventional trench-MOSFETS (VMOSFETS) and/or shielded gate trench MOSFETS (SMOSFETS). Further, for convenience method 400 may be described herein with reference to SMOSFET device 200 having a drain region aligned with its gate electrode (e.g., FIGS. 1, 2A-2F and 3). However, it will be understood that method 400 is not limited to SMOSFET device 200 described herein or the particular design, structure or arrangement of SMOSFET device 200 shown in FIGS. 2A-2H and 3.

In method 400 for fabricating an SMOSFET device (e.g., SMOSFET device 200), providing a semiconductor substrate (410) may include providing a suitably doped silicon substrate for making a VMOSFET or SMOSFET. The silicon substrate may, for example, be an "epi wafer" i.e. a highly doped N-type substrate with an over layer of lightly doped N-type epitaxial silicon grown on the front surface of the wafer. The epitaxial layer (e.g., layer 204, FIG. 2A) may function to host the drain, source and gate regions of the device, while the underlying highly doped portions of the substrate may function as a drain contact for the device.

Next in method 400, forming a trench having a flared or beveled rim (420) may involve etching a trench. Prior to etching the trench, a trench etch mask (e.g., a silicon nitride mask) may be formed on the surface of the silicon and patterned to expose areas to be trenched. Etching the trench may involve dry etching of the silicon substrate through an opening in the patterned mask. The dry etching may utilize halogen-based (e.g., $CF_4$, $SF_6$, $NF_3$, $Cl_2$, $CCl_2F_2$, etc.) plasma etch chemistries. For example, dry etching may utilize $SF_6/O_2$ based etch chemistries. Such fluorine-based etch chemistry may allow shaping of the etched trench profile by allowing continuous adjustment of etch bias and selectively as the trench is being etched. Etch bias and etch selectively may be adjusted during the trench etching process, for example, by ramping $O_2$, power, and/or pressure. In method 400, the example dry etch $SF_6/O_2$ process may be utilized to etch a funnel-shaped trench having a flared or beveled rim, which extends from a top surface of the silicon substrate and narrows down to a trench body extending deeper into the silicon substrate (e.g., FIG. 2A trench 210 beveled rim 220, FIG. 3 trench 310 beveled rim 320).

Further in method 400, forming a drain region, a top of which is aligned with about a lower edge of the flared or beveled rim (440), may involve using ion implantation or solid-source dopant diffusion processes to introduce dopants in a drain region abutting trench sidewalls below about a lower edge of the flared or beveled rim (See e.g., drain region 160, FIG. 2E). Forming the drain region may include disposing suitable masking material (e.g., poly silicon 248, FIG. 2A) on the flared or beveled rim to block or limit introduction of dopants above about the rim's lower edge.

In method 400, forming a gate region abutting the flared or beveled rim above the drain region and forming a source region above the gate region (450) may include disposing a gate oxide and a gate electrode on a lower portion of the beveled rim with the gate electrode extending upward from about the rim's lower edge to a height below the rim's upper edge. Forming a source region above the gate region (450) may involve a source implant to introduce dopants in portions of the silicon substrate above about a top of the gate electrode.

When method 400 is incorporated or merged with methods for making a shielded gate trench MOSFET (e.g., SMOSFET device 200, FIGS. 2A-F), forming the drain region aligned with the lower edge of the flared or beveled rim (440) may be performed (e.g., carried out) after a shield electrode is formed deep in the trench and the trench is filled with inter-gate polysilicon or dielectric up to the lower edge of the flared or beveled rim (FIG. 2C). Further, disposing suitable masking material on the flared or beveled rim may involve utilizing portions of a gate poly silicon layer as the masking material to block or limit introduction of dopants above about the rim's lower edge. Using ion implantation or solid-source dopant diffusion processes to introduce dopants in a drain region may involve forming a recess in the gate poly silicon layer and using angled ion implantation through, or solid-dopant sources placed in, the recess to introduce dopants below about the rim's lower edge to form the aligned drain region (FIG. 2D). Additionally, in method 400 forming a gate region abutting the flared or beveled rim above the drain region (450) may involve utilizing a sub portion of the gate poly silicon layer used as the masking material as the gate electrode.

Also, while the various device embodiments described above can be implemented in a silicon substrate, these device embodiments or similar device embodiments can also be implemented in other types of substrates (e.g., germanium, silicon-germanium, silicon-on-insulator, other semiconductor-on-insulator, III-V compound semiconductor, II-VI compound semiconductor, and other compound semiconductor substrates). Further, the cross-sectional views of the different device embodiments may not be to scale, and as such are not intended to limit the possible variations in the layout design of the corresponding structures. Also, the trench MOSFET devices can be formed in stripe or cellular architecture including hexagonal transistor cells, square shaped transistor cells, and so forth. In some embodiments, one or more types of semiconductor substrates can be used to produce the trench MOSFET devices. Some examples of substrates that can be used include, but are not limited to, silicon wafers, epitaxial Si layers, bonded wafers such as used in silicon-on-insulator (SOI) technologies, and/or amorphous silicon layers, all of which may be doped or undoped.

Implementations of the various techniques described herein may be implemented in digital electronic circuitry, or in computer hardware, firmware, software, or in combinations of them. Some implementations may be implemented using various semiconductor processing and/or packaging techniques.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made.

For example, n-channel SMOSFET devices have been described herein as being fabricated (e.g., with reference to FIG. 2A) using a heavily doped n-type conductive substrate with a lightly doped n-type epitaxial silicon over layer. It will be understood that the disclosure herein is not limited to n-channel devices. In the same of similar manner as the described n-channel devices, p-channel SMOSFET devices may be fabricated using, for example, a semiconductor substrate which is a heavily doped p-type conductive substrate with a lightly doped p-type epitaxial silicon over layer.

What is claimed is:

1. A metal-oxide-semiconductor field-effect transistor (MOSFET) device, comprising:
   a funnel-shaped trench having a flared rim etched in a semiconductor substrate,
   the flared rim having an upper edge at a wider cross section trench opening at about a top surface of the semiconductor substrate and having a lower edge at a top opening of a narrower cross section trench body portion that terminates in the semiconductor substrate;
   a gate electrode disposed in the funnel-shaped trench on a gate dielectric layer formed on the flared rim, the gate electrode having a split structure with a first gate electrode portion being separated from a second gate electrode portion by an insulator material; and
   a source region, a gate region, and a drain region disposed in the semiconductor substrate,
   the gate region abutting a lower portion of the flared rim, the drain region abutting a sidewall of the narrower cross section trench body portion with a top of the drain region being aligned with a lower edge of the gate electrode.

2. The MOSFET device of claim 1, wherein the flared rim has a substantially linear profile in cross-section between the upper edge of the flared rim and the lower edge of the flared rim.

3. The MOSFET device of claim 1, wherein the flared rim has a curved profile in cross-section between the upper edge of the flared rim and the lower edge of the flared rim.

4. The MOSFET device of claim 1, wherein the flared rim is flared at an angle of about 45 degrees to a perpendicular to the top surface of the semiconductor substrate.

5. The MOSFET device of claim 1, wherein the flared rim is flared at an angle of between 20 degrees and 80 degrees to a perpendicular to the top surface of the semiconductor substrate.

6. The MOSFET device of claim 1, wherein the lower edge of the gate electrode is at about the lower edge of the flared rim.

7. The MOSFET device of claim 1, wherein the gate electrode includes at least one of a polysilicon material, a cobalt silicide material, and a titanium silicide material.

8. The MOSFET device of claim 1, wherein the funnel-shaped trench has a depth greater than about 1 μm.

9. The MOSFET device of claim 1, further comprising a shield gate electrode disposed in the narrower cross section trench body portion, the shield gate electrode being insulated from and disposed below the gate electrode.

10. The MOSFET device of claim 1, further comprising a self-aligned source-metal contact.

11. The MOSFET device of claim 1, wherein the semiconductor substrate is a heavily doped n-type conductive substrate with a lightly doped n-type epitaxial over layer, and the funnel-shaped trench terminates within the lightly doped n-type epitaxial over layer.

12. The MOSFET device of claim 1, wherein the semiconductor substrate is a heavily doped p-type conductive substrate with a lightly doped p-type epitaxial over layer, the funnel-shaped trench terminates within the lightly doped p-type epitaxial over layer.

13. The MOSFET device of claim 1, wherein the first gate electrode portion is separated from the second gate electrode portion by about a width of the top opening of the narrower cross section trench body portion.

14. The MOSFET device of claim 1, wherein the gate electrode having an etched opening extending vertically therethrough to the top opening of the narrower cross section trench body portion.

15. The MOSFET device of claim 1, wherein the semiconductor substrate is made of a silicon-based material.

16. The MOSFET device of claim 14, wherein the etched opening is filled with the insulator material.

17. The MOSFET device of claim 14, wherein the semiconductor substrate is made of a silicon-based material.

18. A metal-oxide-semiconductor field-effect transistor (MOSFET) device, comprising:
- a funnel-shaped trench disposed in a semiconductor substrate, the funnel-shaped trench having a flared rim and having a trench body disposed below the flared rim, the flared rim having a sidewall with a first slope and the trench body having a sidewall with a second slope different from the first slope;
- a gate dielectric layer disposed in the trench on the flared rim;
- a gate electrode disposed on the gate dielectric layer;
- a source region abutting an upper portion of the flared rim;
- a gate region abutting a lower portion of the flared rim; and
- a drain region abutting a sidewall of the trench body, the drain region having a top aligned with a lower edge of the gate electrode.

19. The MOSFET device of claim 18, wherein the first slope is about 45 degrees to a perpendicular to a top surface of the semiconductor substrate.

20. The MOSFET device of claim 18, wherein the first slope is about between 20 degrees and 80 degrees to a perpendicular to a top surface of the semiconductor substrate.

21. The MOSFET device of claim 18, wherein the lower edge of the gate electrode is at about a lower edge of the flared rim.

22. The MOSFET device of claim 18, wherein the gate electrode includes at least one of a polysilicon material, a cobalt silicide material, and a titanium silicide material.

23. The MOSFET device of claim 18, further comprising a shield gate electrode disposed in the trench body below the flared rim, the shield gate electrode being insulated from the gate electrode.

24. The MOSFET device of claim 18, wherein the semiconductor substrate is a heavily doped conductive substrate with a lightly doped epitaxial over layer, the funnel-shaped trench terminates within the lightly doped epitaxial over layer.

25. The MOSFET device of claim 18, wherein the semiconductor substrate is made of a silicon-based material.

26. A metal-oxide-semiconductor field-effect transistor (MOSFET) device, comprising:
- a trench in a semiconductor substrate, the trench having a flared rim, the flared rim extending down from a wider cross-section trench opening at about a top surface of the semiconductor substrate to a narrower cross-section trench body portion that terminates in the semiconductor substrate;
- a gate electrode disposed in the trench on the flared rim;
- a drain region in the semiconductor substrate, the drain region having a top aligned with about a lower edge of the gate electrode disposed in the trench on the flared rim;
- a gate region disposed in the semiconductor substrate above the drain region; and
- a source region disposed in the semiconductor substrate above the gate region, the source region including a dopant in a portion of the semiconductor substrate above a top edge of the gate electrode.

27. The MOSFET device of claim 26, wherein the gate electrode includes a polysilicon electrode disposed on a gate dielectric layer disposed on the flared rim.

28. The MOSFET device of claim 26, further comprising a shield gate electrode disposed in the trench body below the flared rim, the shield gate electrode being insulated from the gate electrode.

29. The MOSFET device of claim 26, wherein the semiconductor substrate is a heavily doped conductive substrate with a lightly doped epitaxial over layer, and the trench having the flared rim terminates within the lightly doped epitaxial over layer.

* * * * *